United States Patent
Thomas

(10) Patent No.: US 6,228,680 B1
(45) Date of Patent: May 8, 2001

(54) LOW STRESS METHOD AND APPARATUS FOR UNDERFILLING FLIP-CHIP ELECTRONIC DEVICES

(75) Inventor: Sunil Thomas, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/303,401

(22) Filed: May 1, 1999

Related U.S. Application Data

(60) Provisional application No. 60/084,440, filed on May 6, 1998.

(51) Int. Cl.$^7$ .................................................. H01L 21/44
(52) U.S. Cl. ......................... 438/108; 438/118; 438/125; 438/106; 438/613; 438/661
(58) Field of Search ..................................... 438/106, 107, 438/108, 118, 125, 613, 615, 661, 907; 257/737, 738; 228/180.22

(56) References Cited

U.S. PATENT DOCUMENTS

| | | | |
|---|---|---|---|
| 5,121,190 | * 6/1992 | Hsiao et al. | 257/778 |
| 5,371,328 | * 12/1994 | Gutierrez et al. | 174/261 |
| 5,668,059 | * 9/1997 | Christie et al. | 438/118 |
| 5,919,329 | * 7/1999 | Banks et al. | 156/281 |
| 5,930,597 | * 7/1999 | Call et al. | 438/106 |
| 5,930,598 | * 7/1999 | Wille et al. | 438/108 |

\* cited by examiner

Primary Examiner—Eddie C. Lee
Assistant Examiner—N. Drew Richards
(74) Attorney, Agent, or Firm—Gary C. Honeycutt; Fred Telecky; Arthur I. Navarro

(57) ABSTRACT

A semiconductor assembly and method of fabrication comprising an integrated circuit chip, an electrically insulating substrate, a multitude of solder balls for interconnecting both parts while spacing them apart by a gap, and a polymeric encapsulant filling the gap. The method of fabrication includes heating and cooling cycles, based on stress modeling, such that all mechanical stress levels in the dielectric layers of the circuit chip and in the solder balls are reduced to levels safe for operating the semiconductor assembly.

2 Claims, 5 Drawing Sheets

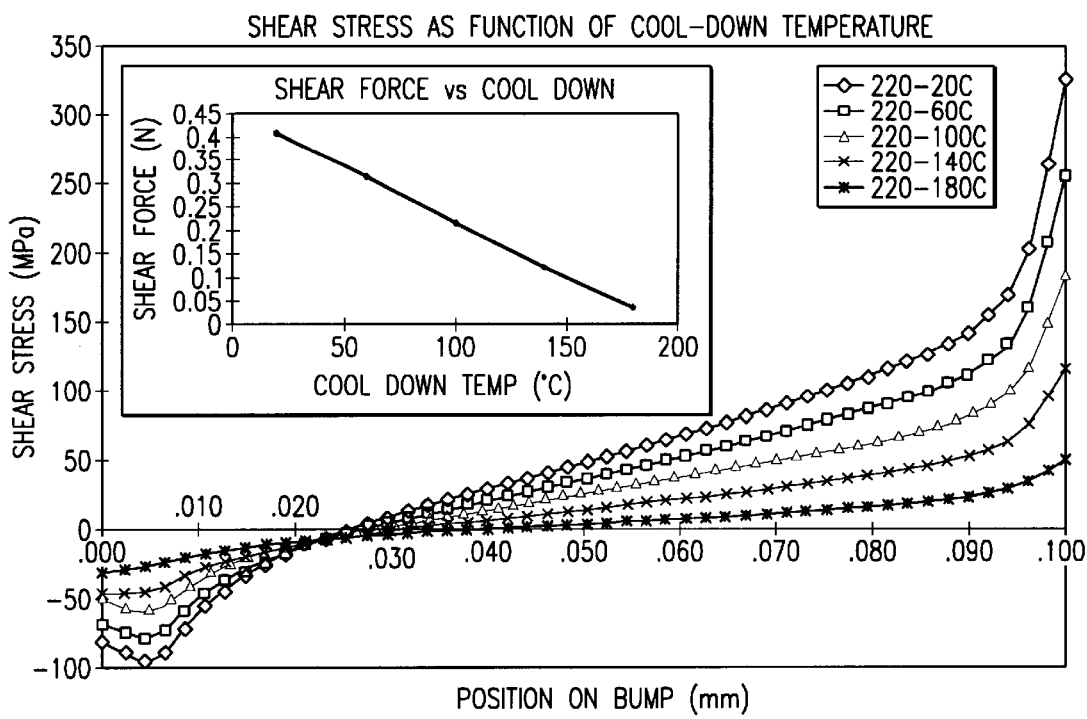
APPENDIX FIG. 1
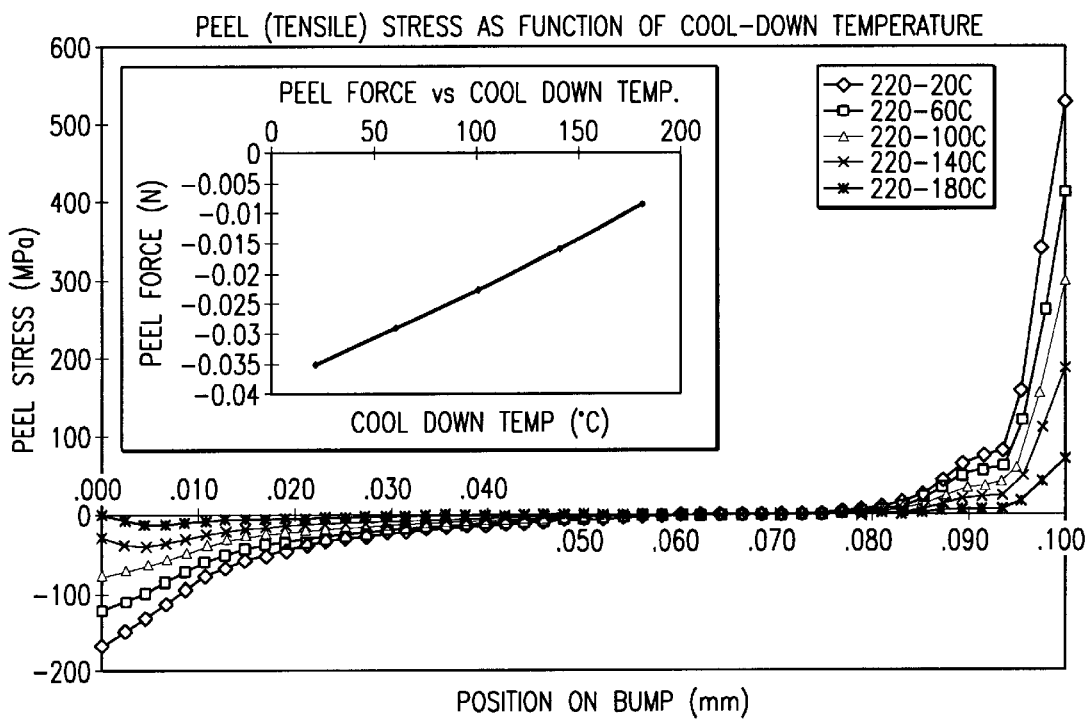
APPENDIX FIG. 2

LOW STRESS METHOD AND APPARATUS FOR UNDERFILLING FLIP-CHIP ELECTRONIC DEVICES

This application claims priority under 35 USC119 based upon Provisional Application No. 60/084,440 filed May 6, 1998.

The present invention relates in general to the field of integrated circuit assembly and more specifically to methods of reducing mechanical stresses when semiconductor chips having dielectric layers of low dielectric constants are flip-chip assembled onto substrates.

BACKGROUND OF THE INVENTION

It is known to mount a semiconductor chip having an integrated circuit chip to a printed circuit substrate by solder bump interconnections. The integrated circuit on the semiconductor chip is spaced apart from the printed circuit substrate by a gap. The solder bump interconnections extend across the gap and connect contact pads on the integrated circuit chip to contact pads on the printed circuit substrate to attach the chip and then conduct electrical signals, power and ground potential to and from the chip for processing. There is a significant difference between the coefficient of thermal expansion (CTE) between the semiconductor material used for the chip and the material typically used for the substrate; for instance, with silicon as the semiconductor material and plastic FR-4 as substrate material, the difference in CTE is about an order of magnitude.

As a consequence of the CTE difference, mechanical stresses are created when the assembly is subjected to thermal cycling during use or testing. These stresses tend to fatigue the solder bump interconnections, resulting in cracks and thus eventual failure of the assembly. In order to strengthen the solder joints without affecting the electrical connection, the gap is customarily filled with a polymeric material which encapsulates the bumps and fills any space in the gap between the semiconductor chip and the substrate. For example, in the well-known "C-4" process developed by the International Business Machines Corporation, polymeric material is used to fill any space in the gap between the silicon chip and the ceramic substrate.

The encapsulant is typically applied after the solder bumps are reflowed to bond the integrated circuit chip to the printed circuit substrate. A polymeric precursor, sometimes referred to as the "underfill", is dispensed onto the substrate adjacent to the chip and is pulled into the gap by capillary forces. The precursor is then heated, polymerized and "cured" to form the encapsulant. It is well known in the industry that the elevated temperature and the temperature cycling needed for this curing can also create mechanical stresses which can be detrimental to the chip and the solder interconnections. The stresses may delaminate the solder joint, crack the passivation of the chip, or propagate fractures into the circuit structures. In general, the sensitivity to cracking of the layered strucutres of integrated circuits is increasing strongly with decreasing thicknesses of the various layers.

Technical approaches have been proposed with the intent to reduce or mitigate the detrimental effects of the thermally induced stresses upon the assembly and thereby extend the useful life of the assembly. As an example, U.S. Pat. No. 5,720,100 of Feb. 24, 1998 (Skipor et al., "Assembly Having a Frame Embedded in a Polymeric Encapsulant and Method for Forming Same") describes a method of embedding a frame made of ceramic or alumina in the polymeric precursor prior to curing such that the frame is disposed about the integrated circuit chip. During curing and later during thermal cycling, the frame provides enhanced mechanical strength by locally constraining the substrate and the encapsulant to reduce the effect of stresses, and the frame is affixed to the substrate so that the frame becomes an integral part of the substrate. The proposal is expensive and does not prevent the stresses to appear in the first place. Until now, there has been no known production-worthy solution to the problem of thermally induced stress and its deleterious effects on mechanically brittle insulator or metal-semiconductor structures.

In addition, there is presently a strong effort throughout the semiconductor industry to increase the speed of multi-level metallization integrated circuits by reducing the RC time constant, with preference of reducing the interlevel and intralevel capacitance C, rather than the resistance R. One way of reducing C is by developing insulator layers with materials or structures exhibiting low dielectric constants, with the additional benefit of minimiziong voltage induction, or cross talk, between adjacent signal lines (a requirement particularly important for digital signal processing devices).

One approach to fabricate thin layers of low dielectric constant has been described in U.S. Pat. No. 5,607,773 of Mar. 4, 1997 (Ahlburn et al., "Method of Forming a Multilevel Dielectric"). It teaches a method of depositing and curing layers alternating between plasma-generated tetraethylorthosilicate (TEOS) oxide and silicon-containing hydrogen silsesquioxane (HSQ). The dielectric constant of an HSQ film is lower than the dielectric constant of a plasma TEOS oxide or ozone TEOS oxide. Also, the density and porosity of the dielectric film affect the dielectric constant through absorption or desorption of water. Other efforts are studying the formation of thin layers of organic material or chemical vapor-deposited polymers. In all these endeavours (and even in hard oxides) experience has shown abundantly that decreasing film thickness causes dramatic increases in layer sensitivity to mechanical stresses. This trend is especially pronounced in large-area chips because the stress levels increase with increasing distance from the center of the chip. Thin layers easily develop cracks, and thus device failure, during attachment to customer circuit boards or during device operation and temperature cycling and testing.

Consequently, a need has arisen for an assembly material selection and method of fabrication that provide stress-free, simple and low-cost processes for chip-to-substrate assemblies, applicable to large-chip semiconductor products. At the same time, the method should be flexible to be applied to a wide spectrum of material and process variations, leading to improved semiconductor device reliability. Preferably, these improvements should be accomplished using the installed equipment base so that no investment in new manufacturing machines is needed.

SUMMARY OF THE INVENTION

The present invention comprises semiconductor ball-grid array packages, chip-size packages and flip-chip assemblies with improved mechanical reliability achieved by dramatically reduced stress during fabrication. The invention is particularly important for all semiconductor products employing thin insulating layers with low dielectric constants and high mechanical brittleness, often in a multi-level architecture. The invention defines the process rules for solder attachment and underfill and the methods for fabricating the chip/substrate assemblies without cracking the thin dielectric layers.

Semiconductor assemblies such as ball-grid array packages contain meterial with different coefficients of thermal expansion (CTE); they are coupled mechanically intimately, even rigidly to each other. Expressing CTE in ppm/° C., silicon has approximately 2.3, various metals from 4.3 to 17.0, and various plastics from 16.0 to 25.0. Consequently, whenever these assemblies undergo temperature excursions, the swings of increasing and decreasing temperatures induce different expansions and contractions in the materials coupled each other, causing tensile and compressive stresses to build up in the component parts. If the package were a uniform laminate structure, the stresses in each individual layer could be analytically modeled. However, the package is not a uniform laminate, and the variations from the uniform laminate case create stress concentrations. Further, the package is assembled through a series of thermal process steps which build in stresses between various layers. Finite element analysis and measurements by test structures have proven indispensable in quantifying these stresses and locating strain and stress maxima.

In known technology, these strain and stress maxima are seen to cause severe reliability failures. At risk are especially brittle thin insulator films in the multilevel interconnection hierarchy of the chips, passivation layers over the semiconductor, plastic materials close to the chip corners, and solder joints located close to the chip and package corners. The processing approach of this invention eliminates the formation of stress in the first place and thus allows a radical improvement of product reliability.

For the design of the equipment, the invention applies certain laws of fluid dynamics and deformable medium and extends them to complex conditions of semiconductor product fabrication.

For a deformable medium flowing in a tube having different cross sections q in various parts, continuity requires that the amount of deformable medium flowing per unit of time through each cross section is directly proportional to q and to the velocity v in this cross section:

$$qv=\text{const.}$$

In a tube, a deformable medium flows fastest at the smallest cross section.

The velocity v of the flowing medium of density $\rho$ is correlated to its pressure p after BERNOULLI by $$\tfrac{1}{2}\rho v^2+p=\text{const.}$$

pressure of a flowing medium is the smaller the greater its velocity is. Consequently, the pressure at the smaller cross sections is smaller than at the larger cross sections.

When the parts of the tube with different cross sections are separated by different lengths l of the tube, one also has to consider the drop of pressure along the tube lengths; the drop, in turn, depends on the charactieristics of the flow, laminar versus turbulent.

A deformable medium flowing in a tube of radius r and length l at a velocity v, averaged over the tube cross section, experiences a pressure drop $\Delta p$ due to friction. For idealized conditions, such as neglecting the inertia of the flowing medium, HAGEN and POISEUILLE have found for laminar flow $$\Delta p=8\eta l v/r^2.$$

($\eta$=dynamic viscosity)

The pressure drop of the medium along the tube length is directly proportional to the first power of the average velocity and inverse proportional to the second power of the tube radius.

In contrast, for turbulent flow the relationship is $$\Delta p=\rho\lambda l v^2/r.$$

($\rho$=density, $\lambda$=dimensionless number related to REYNOLD's criteria of transition from laminar to turbulent flow)

The pressure drop of the medium along the tube length is directly proportional to the second power of the average velocity and inverse proportional to the first power of the tube radius.

The invention includes equipment for dispensing deformable medium under the requirement to dispense, per unit of time, equal amounts of deformable medium at the outlets of all distribution tubes. Since the distribution tubes are connected by different lengths of header, the pressure drop along these lengths have to be compensated by modifying the cross section of each outlet ("nozzle") such that equal amounts of deformable medium per unit time will exit through the nozzles. Practical solutions are complex due to the relatively high viscosity of the deformable medium to be used, and the fact that the medium is a mixture of plastic precursor and finely dispersed but concentrated solid fillers. Important design features of the equipment are obtained graphically, with the flowing characteristics of the medium (polymeric precursor, fillers, temperature, viscosity) as parameter. For distribution nozzles at repetitive distances ("pitch"), the whole-number multiples of the edge outline of the chips-on-substrates to be assembled serves as another parameter.

It is an object of the present invention to leapfrog the reliability of semiconductor ball-grid array and chip-size packages by selective temperature profiling of solder attachment and underfill processes.

Another object of the present invention is to provide equipment design and process methods which are flexible so that they can be applied to several families of products, and are general, so that they can be applied to several future generations of products.

Another object of the present invention is to provide a low-cost and high speed process for fabrication and assembly.

Another object of the present invention is to minimize the cost of capital investment and to use the installed fabrication equipment base.

These objects have been achieved by the design of the equipment and process flow of the invention and a mass production process. Various modifications have been successfully employed to satisfy product geometries and material selections.

In one embodiment of the invention, a method of temperature variation in underfill processes is provided, based on finite element analysis, to reduce stress in dielectric layers of the chips and in solder ball joints of the assemblies to values safe for operating the assembly.

Another embodiment of the invention comprises an apparatus for temperature control and temperature measurement, suitable for practising the fabrication method of the invention to mass produce stress-reduced assemblies.

Another embodiment of the invention comprises an apparatus for multiple controlled dispensing of a deformable medium.

In a further embodiment of the invention, the dispense rate of an apparatus for multiple controlled dispensing is correlated with the distance of the nozzles from the center feed tube and the cross section of the nozzle, so that a desirable dispense rate can be produced, for instance a rate which is equal for all nozzles.

The technical advances represented by the invention, as well as the objects thereof, will become appararent from the following description of the preferred embodiments of the invention, when considered in conjunction with the accompanying drawings and the novel features set forth in the appended claims.

BRIEF DESCRIPTION OF THE DRAWINGS

APPENDIX FIG. 1 is a graph of modeling results for shear stress and shear force as a basis for defining process parameters of the invention.

APPENDIX FIG. 2 is a graph of modeling results for peel (torque) stress and peel (torque) force as a basis for defining process parameters of the invention.

DETAILED DESCRIPTION OF THE PREFERRED EMBODIMENTS

Figure 1:
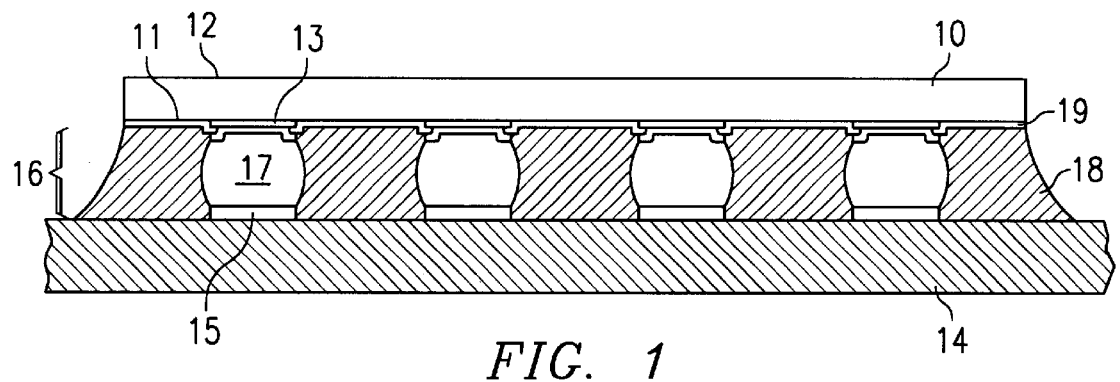
FIG. 1 is a simplified and schematic cross section of an integrated circuit chip attached to a substrate using solder balls, with the gap between chip and substrate filled with a polymeric encapsulant.

The present invention provides the process to minimize the mechanical stress in a microelectronic assembly as shown schematically and simplified in FIG. 1. A portion of the assembly in FIG. 1 is enlarged in FIG. 2 to show some detail of the thin layer structure. An integrated circuit chip 10, preferably formed of silicon, comprises an active surface 11 and an inactive surface 12 which are planar and parallel to each other. A plurality of contact pads 13, preferably made of aluminum 13a and a combination of refractory metal, such as titatnium or tungsten, and nobel metal, such as palladium, gold or platinum, are disposed on active surface 11. Chip 10 is mounted to a substrate 14, integral with interconnections and a plurality of contact pads 15, yet spaced apart by a gap 16. Substrate 14 preferably comprises a printed circuit board made of FR-4 or a glass-epoxy laminate; contact pads 15 are preferably composed of solder-wettable copper. Chip 10 is attached by solder bumps interconnections 17 which extend across the gap and connect the contact pads 13 on the chip to the contact pads 15 on the substrate both electrically and mechanically. Preferably, a lead-tin alloy of a desirable melting temperature is chosen for solder bumps 17 to accomplish the solder reflow at a practical temperature.

Figure 2:
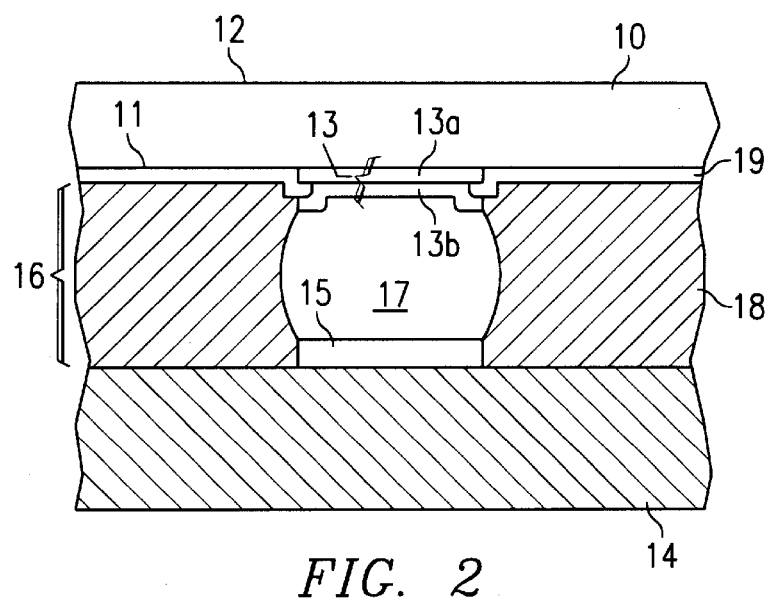
FIG. 2 is an enlargement of a portion of FIG. 1, highlighting some detail of the thin layer structures.

For silicon chips, the protective overcoat 19 in FIGS. 1 and 2 is preferably made of silicon nitride with a typical in the range from 800 to 1200 nm. Inside most modern high-speed integrated circuits themselves, the dielectric layers used in the multi-level metal hierarchies are preferably made of insulators with low dielectric constants. Examples for these dielectric layers are hydrogen silsesquioxane-based (HSQ) spun-on glass; or a sandwich structures of a first film formed of plasma-generated tetraethylorthosilicate (TEOS) oxide, followed by a second film formed of inorganic porous, low density HSQ silicon oxides, followed by a third film formed of plasma-generated TEOS oxide; or methylsiloxane-based spun-on glass. The thickness of a typical sandwich preferably ranges from 300 to 700 nm. Another option is a layer made of organic materials. The goal is in every case to generate dielectric layers with a dielectric constant between about 4.0 and 3.0.

The gap 16 is filled with a polymeric encapsulant 18 that extends over the printed circuit board about the perimeter of the chip. The main purpose of encapsulant 18, commonly referred to as the "underfill" material, is a reduction of mechanical stress in the assembly; another purpose is the protection of the active chip surface. To appreciate the inadequacy of the known technology related to the underfill and the importance of the invention, origin of the mechanical stress has to be investigated.

Silicon, the preferred semiconductor material of chip 10, has a CTE between 2 and 3 ppm/° C., typical substrates 14 however a CTE between about 15 and 22 ppm/° C.; CTEs of the metals in the assembly vary from 4.3 to 17.0. The materials are mechanically coupled intimately, even rigidly, to each other in the assembly of a ball-grid array package. For the standard assembly process flow of a large-chip ball-grid array package, the temperature profile is plotted as function of assembly time in FIG. 3, with temperature measured in ° C., time in minutes. In the same graph, stress (in arbitrary units) as determined by finite element modeling of the same package is also plotted as a function of assembly time.

Figure 3:
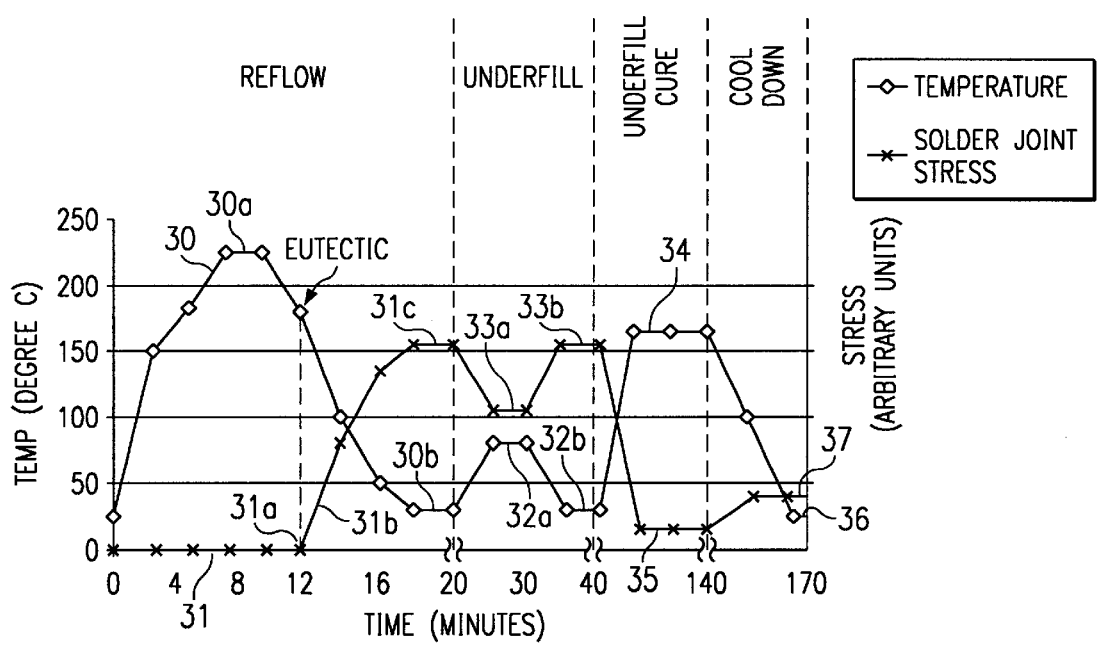
FIG. 3 depicts the time diagram of temperature and stress in the standard assembly process for flip-chip ball-grid array devices.

In the first 20 min of the standard assembly process flow depicted in FIG. 3, the reflow of the solder bumps follows the temperature profile indicated by graph section 30, while the corresponding stress profile is plotted by graph section 31. The temperature reaches the maximum of 220° C. (reference number 30a) because of an overshoot over the melting temperature of 183° C. of the eutectic tin-lead alloy (63 weight % tin). After the solder has molten and is beginning to cool, the stress is zero, as indicated by reference point 31a, and stays zero to the eutectic temperature of 183° C. With continued cooling of the assembly, though, stress starts appearing (31b) and increases rapidly. When room temperature is reached (30b), the stress levels reach levels so high (31c) that damage by cracking has been inflicted to the structurally weakest parts of the assembly, especially the solder joints, the chip multilevel dielectric films, or the protective overcoat film 19 in FIGS. 1 and 2. The integrated circuit chip 10 in FIGS. 1 and 2 is now arranged on substrate 14 such that each of the substrate contact pads 15 registers with a chip contact pad 13, with the solder bumps therebetween. By way of example, the gap 16 between active surface 11 of the chip and the substrate is preferably between 25 and 150 μm.

In the standard process flow, the next step is renewed heating of the assembly in order to underfill the polymeric precursor 18 into the gap 16. The assembly is moved to the underfill work station and the temperature is inceased to 75 to 90° C. (reference number 32 in FIG. 3) in order to lower the viscosity of the plastic precursor. The standard dispensing procedure using a syringe with a single nozzle will be described in FIG. 7. Usually, one or more drops of the polymeric precursor are dispensed onto the substrate 14 adjacent to the perimeter of chip 10. The precursor is then drawn into gap 16 by capillary forces until it completely fills gap 16 from the chip surface to the substrate and surrounding the solder balls, leaving no void which would initiate additional failure mechanisms.

While at the dispensing temperature, the stress in the assembly drops, as indicated by the decline of the stress data in FIG. 3 from 31c to 33a. However, as soon as the assembly is moved to the next work station for cooling to room temperature (32b), the stress inceases again to values (33b) as high as in the previous cooling cycle (31c). At these stress levels, continued damage by cracking structurally weak dielectric films of the chip is likely. Moving the assembly to the next work station, the temperature is raised again (34), between about 120 to 180° C., in order to polymerize, or "cure", the polymeric precursor. After 60 to 120 min, the assembly with the finished encapsulant is slowly brought back to room temperature (36).

During the curing cycle, the stress values are small again (35), but incease one more time during the cooldown period. They remain at acceptable low-to-intermediate levels (37), due to the encapsulant characteristic of distributing and absorbing stress. The resulting encapsulant typically exhibits a CTE between about 18 and 30 ppm/° C., approximately an order magnitude higher than the CTE of the silicon chip.

Figure 4:
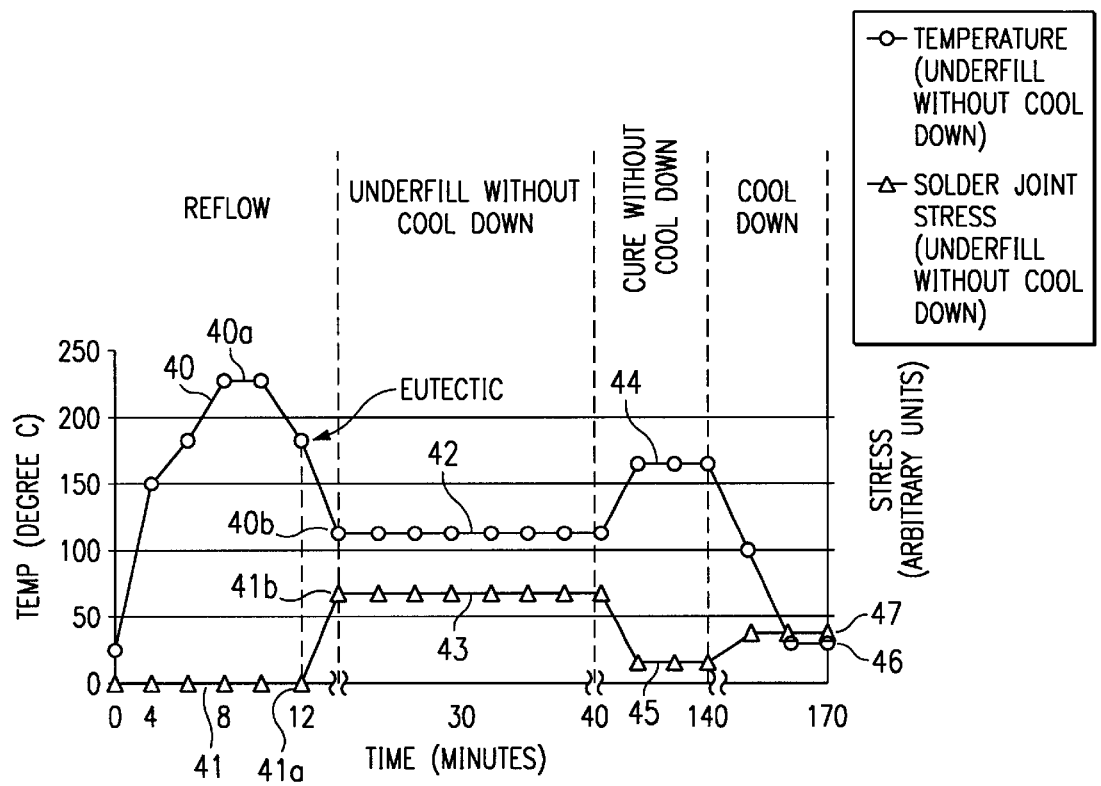
FIG. 4 depicts the time diagram of temperature and stress in the assembly process for flip-chip ball-grid array devices according to the present invention.

According to the invention, the method of fabrication described above is carefully modified in order to avoid the appearance of stress in the first place. Based on extensive stress modeling results to be decribed below, FIG. 4 shows the new temperature-time and stress-time diagram of the new assembly process flow. During the 20 min solder reflow period 40, the melting temperature of 183° C. for the eutectic lead-tin mixture is overshot to about 220° C. (for about 60 to 120 s, as indicated by reference number 40a in FIG. 4). The stress curve 41 indicates stress level zero, 41a, and remains at zero level 41a to the eutectic melting temperature of 183° C. During the following cooling, the solder solidifies, but the assembly is kept at an elevated temperature between 80 and 140° C., preferably between 90 and 100° C. (in FIG. 4, reference number 40b). In this time period, the stress increases slightly from its zero level 41a to a non-critical value 41b, well below any level which could pose a risk to structurally weak dielectric layers of the chip or the solder joints. The height of the solidified solder bumps is preferably between 25 and 150μ, often approximately 100 μm.

It is pivotal that the assembly not be allowed to continue the cooling process down to room temperature, but is maintained at a constant elevated temperature (42 in FIG. 4) throughout the underfill period, which lasts about 20 min. The apparatus according to the invention is described below in FIG. 6, the equipment for the underfilling process is described in FIGS. 8, 9 and 10. Referring again to FIGS. 1 and 2, the polymeric precursor is dispensed onto substrate 14 adjacent to the perimeter of chip 10. The polymeric precursor is formed of a material curable by thermal or radiation energy, preferably composed of an anhydride-hardened prepolymer such as an epoxy resin. It usually contains a catalyst such as an amine compound, and fillers such as silica (or alumina). A suitable material is supplied by the Dexter Hysol Corporation under brand FP 4527. During the underfilling cycle without cool down, the stress in the assembly remains at the low level 43 in FIG. 4.

Furthermore, the apparatus of the invention avoids the need of a cool down to room temperature after the underfilling process. Rather, the assembly can remain in the same chamber and proceed directly to the inceased temperature 44 needed for polymerizing ("curing") the underfill precursor. During this time span (about 60 to 120 min), the stress falls to the very low level 45 in FIG. 4. After the encapsulant is fully cured, the temperature is allowed to drop to room temperature 46 in the cool down period, while the stress inceases only slightly to values 47, well below any risk for damage to structurally weak dielectric films or solder joints. As intended, the stress throughout the assembly is approximately uniformly distributed and for the most part absorbed by the encapsulant.

In order to define both effective and practical procedures for minimizing the detrimental effects of excessive stress generated in assembling semiconductor chips on substrates using solder interconnections, a solder ball, or bump, of 0.1 mm height, or diameter, in worst position in a corner of the chip-substrate assembly has been selected for finite element analysis. The worst position has been identified earlier by failure analysis of units with cracked solder joints, or cracked dielectric or protective insulator layers. The magnitude of shear stress and peel (tensile) stress have been analyzed as a function of their position from one point of the bump perimeter to the opposite point diagonally across. As a parameter, the stresses are plotted in dependence on the cooling temperature (220 to 20° C. compared to 220 to 180° C., with several options in between). By way of example, the graphs for shear stress are reproduced in APPENDIX FIG. 1, the graphs for peel (tensile) stress in APPENDIX FIG. 2.

The common feature of both figures is appearance of significant amount of stress, measured in megapascals, MPa, across the bump diameter, changing from negative values at the perimeter side located closer to the assembly center, to positive values at the perimeter side located away from the assembly center. Both the shear and the tensile stresses reach high values for the wide temperature excursions and shrink to acceptable stress values only when modest temperature excursions are employed, such as from 220 to 100° C. This result makes end temperatures of the cooling cycle in the proximity of 100° C. attractive and practical. In insert of APPENDIX FIG. 1 shows the shear force resulting from the shear stress and how it depends on the end temperature of the cooling cycle. The insert of APPENDIX FIG. 2 shows the trend of the peel (tensile) force caused by the tensile stress as a function of the end temperature of the cooling cycle. In both cases, an end temperature around 100° C. causes a force quite tolerable in view of the mechanical strength of the solder joint and the dielectric layers.

Figure 5:
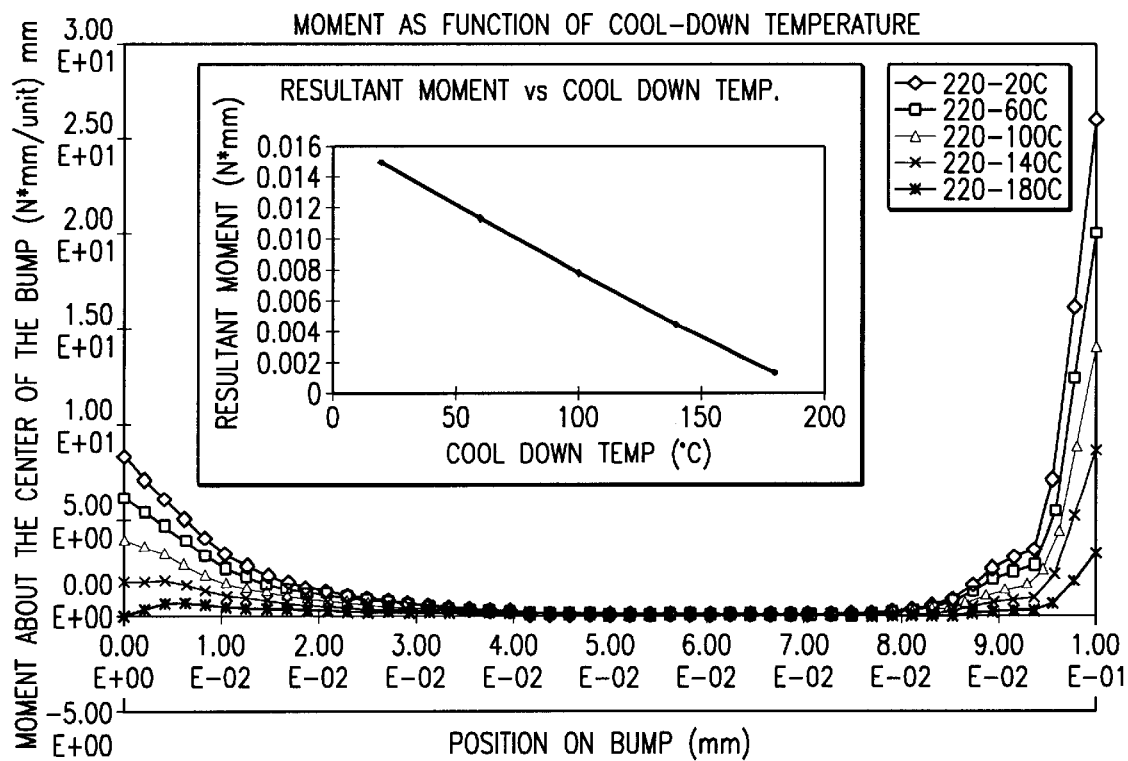
FIG. 5 exemplifies the modeling results underlying the process according to the invention, plotted as the moment (torque) as a function of the assembly cool-down temperature.

Both figures of the APPENDIX can be summarized in FIG. 5. By way of example, in FIG. 5 the moment (torque) with regard to the center of the bump/ball, generated by the integrated forces multiplied by the displacement across the bump interface, is analyzed in dependence on the position within the bump. Again, the worst-case solder ball in the corner of the package has been selected for analysis, the bump height or diameter is 0.1 mm. As can be clearly seen, the moment reaches significant values at the perimeter of the bump/ball, but can be reduced to tolerable values by keeping the end temperature of the cooling cycle to values around 100° C. The insert of FIG. 5 plots the resultant moment (torque), expressed in newtons-times-millimeter, Nmm, as a function of the end temperature of the cooling cycle. The resultant moment reaches acceptable values when the end temperature of the cooling cycle is held constant in the proximity of 100° C. The moment (torque) experienced at this cool down temperature can be tolerated even by the mechanically weakest solder joint or dielectric layer. A temperature range of about 90 to 130° C. is quite practical from the standpoint of materials, processes and equipment, and the constraints of mass production. Consequently, the invention prefers a final temperature of about 100° C. in the cool down cycle. For some products, 110° C. is the preferred cool down temperature; this value is used in FIG. 4.

Figure 6:
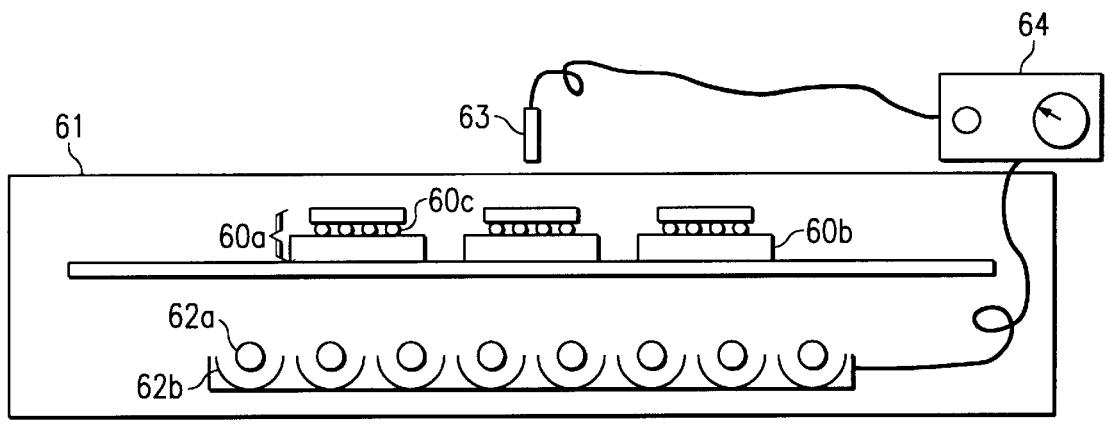
FIG. 6 shows schematically the temperature control and measurement features of the apparatus for mass production according to the process of the invention.

As an embodiment of the invention, FIG. 6 shows schematically part of a process chamber for semiconductor ball-grid array packages and flip-chip on substrate assemblies 60a, which offers the temperature cycles and controls required by the process depicted in FIG. 4. A chamber 61 with gas and humidity controlled atmosphere can place a multitude (up to several hundred) of units simultaneously over a series of tungsten halogen lamps 62a. Radiant heat is applied from the back of the substrates 60b. The radiant energy may be applied using the lamps alone, or using reflectors 62b to enhance the efficiency. The tungsten halogen lamps are of the type described in patent application Ser. No. 08/743,691, filed Nov. 6, 1996, which is a continuation of Ser. No. 08/255,197, filed Jun. 7, 1994, titled "Optical Die Bonding for Semiconductor Devices", and patent application Ser. No. 60/066,268, filed Nov. 20, 1997, titled "Wafer-Scale Assembly of Chip-Size Packages", both assigned to Texas Instruments Incorporated. The use of radiant energy sources, as opposed to furnaces, allows rapid temperature ramping or profiling, and also more uniform and more easily controllable heating and cooling cycles. Radiant heating allows a smooth transition from ambient temperature to the desired hot temperature, and rapid thermal response. The radiant energy is preferably provided by an optical heat source emitting near infrared light, such as incandescent lamps (halogen lamps with tungsten filament and xenon filling). For instance, silicon has been found to absorb rapidly near-infrared light, which is light having a wavelength of 0.8 to about 2.8 $\mu$m. Furthermore, selected reflective surfaces do not absorb near-infrared light, so that the heating can be restricted to the packages themselves; by using selected reflective surfaces on the carrier or other nonactive areas exposed to the light, the packages can be heated while the remainder of the surfaces stay at a much lower temperature. Consequently, the packages rapidly heat up to a temperature at which the solder balls 60c begin to melt and reflow (typically 183° C.).

It is an important feature of this invention that the heating and precursor dispensing steps are performed in a single apparatus and in a single operation without moving and without the risk of losing any alignment or suffering particulate contamination, as could easily occur in a conventional chain furnace heating operation. The solder reflow step is followed and is combined with the underfilling step, and does not just represent the heating of preassembled parts.

A closed-loop temperature control strategy is employed to control the temperature profile of the chips-under-assembly. The package temperature is changed by changing the voltage across the lamps, since the amount of heat produced by the lamps is proportional to its voltage. Non-contact or contact style thermocouples or pyrometers 63 monitor the real time/temperature of the assemblies and feed the information back to temperature controller 64 which modifies the voltage across the lamps with respect to some mathematical function of the difference between the actual package temperature and the predetermined desired package temperature. The heating and cooling steps may be performed, for example, in an inert gas environment, such as dry nitrogen or filtered gases, to provide for additional process control and to prevent particulates from settling on the device surfaces.

In the preferred embodiment for rapid temperature profiling, the reflector assemblies (reference number 62b in FIG. 6) are constructed to be especially low mass, utilizing a light-weight rigid skeleton with a thin sheet metal reflector surface. The interior of the reflective surfaces are highly polished aluminum (high relectivity and low absorption in the wavelength range used). The exterior surfaces of the reflective components are treated for high temperature-compatible dark surfaces, increasing emissivity and re-radiation from the exterior surfaces, hence faster cooling capability of the reflector assembly.

Figure 7:
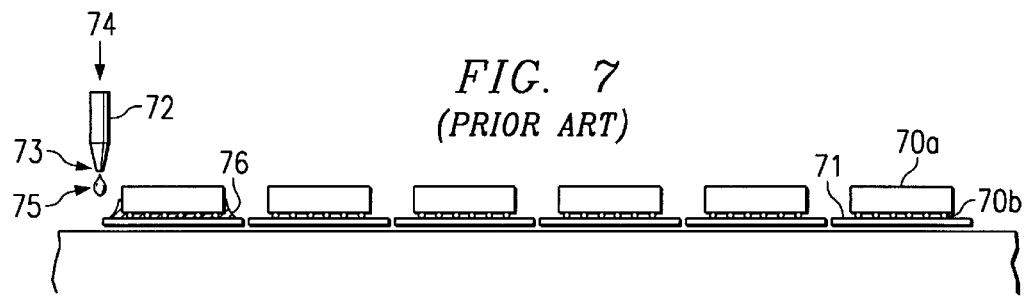
FIG. 7 shows schematically the conventional underfilling process with a single dispensing nozzle.

In the standard process flow, a plurality of chips 70a with solder balls 70b and substrates 71 are placed on a support, as schematically illustrated in FIG. 7. A syringe 72 with a single nozzle 73 is placed adjacent to the perimeter of chip 70a. The polymeric precursor 74 is dispensed under slight pressure so that a drop 75 is formed at th nozzle. After separation of the drop, a bead is applied along the chip perimeter. With the substrate 71 preheated as described above, the precursor is drawn into the gap between chip 70a and substrate 71 by capillary forces. One or more drops of polymeric precursor will thus form fillet 76 for the assembly. Thereafter, capillary 72 is moved over to the next chip and substrate in order to produce the next assembly. The whole process consumes much time and is hard to control.

Figure 8:
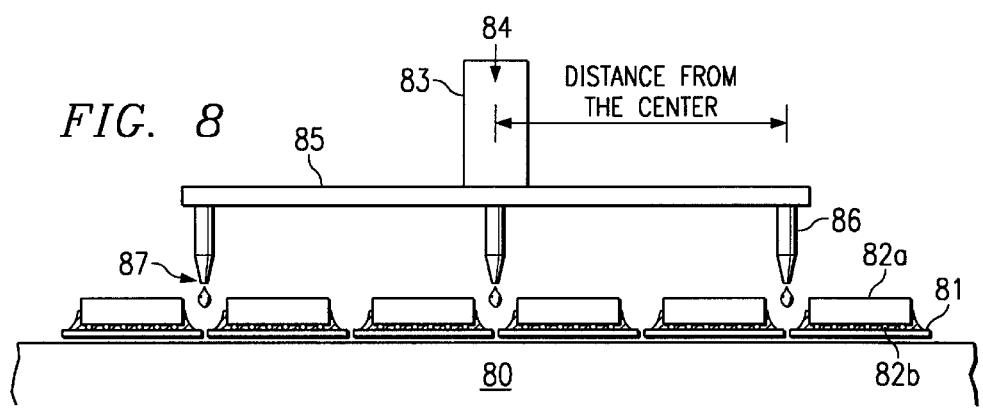
FIG. 8 shows schematically the multi-nozzle dispensing equipment according to the present invention, used for dispensing deformable material to underfill devices at uniform rate.

The present invention is depicted in the embodiment schematically shown in FIG. 8. A controllably heatable support 80 can receive and hold a multitude of substrates 81. Each substrate is made of electrically insulating material and has a plurality of interconnecting wiring strips and a pattern of metal contact pads. Over each substrate is aligned a semiconductor integrated circuit chip 82a, such as a digital signal processor, a microprocessor, an analog device, a logic device, or a memory device. Each chip 82a has a pattern of metal contact pads mirror-imaging the pattern of the contact pads on the substrates 81, and one solder ball 82b attached to each contact pad. Chips 82a with solder balls 82b are aligned to the respective substrates such the solder balls are positioned on the respective substrate contact pads.

Thermal energy is supplied to and later withdrawn from the chips and substrates using the equipment and controls described in FIG. 6 in order to achieve the temperature-time profile of the invention described in FIG. 4. When the solder balls 82b have reached their melting temperature (183° C. for eytectic lead-tin mixtures), their reflow is controlled so that their resulting height defines a gap spacing chip and substrate apart (for instance, 0.1 mm). The assembly is cooled according to the process described in FIG. 4 so that the solder soldifies, but the assembly remains at a temperature between 90 and 130° C. A preferred temperature is approximately 100° C. At this temperature, mechanical stress in the assembly remains at low values (see FIG. 5), well below any risk for introducing cracks in weak structures such as solder joints and dielectric films.

An apparatus for multiple controlled dispensing of polymeric precursor is moved over the assembly as shown in FIG. 8. This apparatus consists of a center feed tube 83, through which the polymeric precursor or any other feformable medium 84 is supplied under slight pressure. A header 85 is connected to the center feed tube 83 and a plurality of distribution tubes 86. FIG. 8 shows an example of three distribution tubes, but any number can be arranged. Each distribution tube 86 acquires a predetermined well-defined distance from the center of feed tube 83. At the end of each distribution tube 86 is a nozzle 87.

Figure 9:
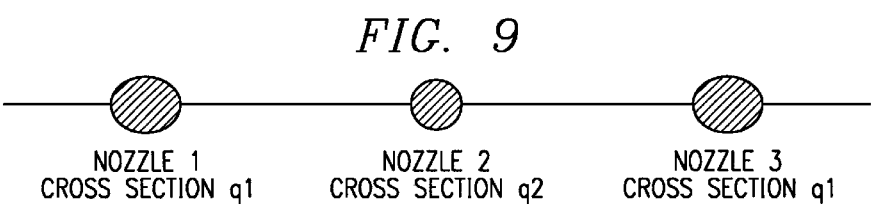
FIG. 9 compares the cross section of the nozzles used in the dispensing equipment of FIG. 8.
Figure 10:
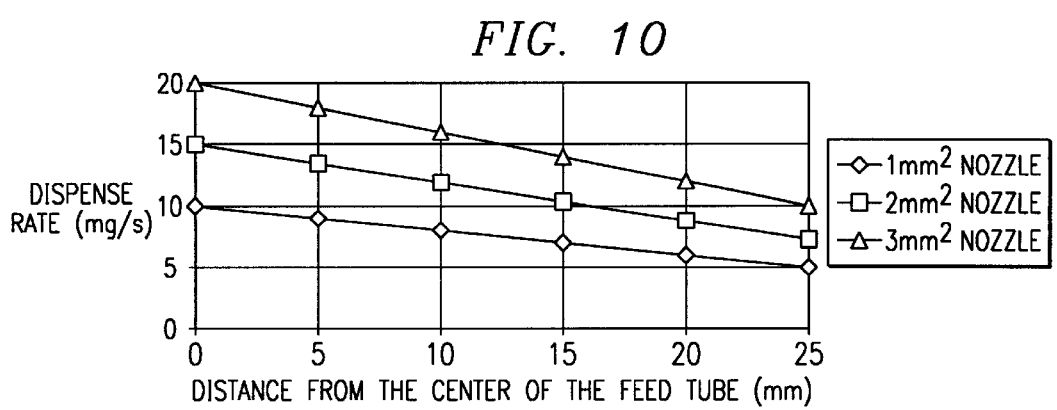
FIG. 10 shows the generalized relation between dispense rate, distance of the dispensing nozzle from the center feed tube, and nozzle cross section according to the invention.

It is of pivotal importance for the present invention that the cross section of each nozzle 87 is correlated to the distance of the respective distribution tube 86 from the center line of the center feed tube 83. The nozzles have increasingly larger cross sections, the farther the respective distribution tube is positioned from the center tube. This relation is schematically illustrated in FIG. 9 for the three distribution tubes of FIG. 8. Based on this relation, the dispense rate of the polymeric precursor or any other deformable medium 84 can be kept the same for all distribution tubes. This condition is, of course, essential for a mass production method. More quantitatively, FIG. 10 shows the desired dispense rate, measured in milligrams per second (mg/s) as a function of the distance of a specific distribution tube from the center of the feed tube, measured in millimeters (mm). The parameter of the set of graphs in FIG. 10 is the nozzle cross section, measured in square millimeters (mm$^2$).

While the formation of the droplets and thus the desired dispense rate, supplying the underfill amount needed for a fast and reliable mass production, depends on the selected material of the deformable medium (examples are liquids, viscous polymeric precursors, epoxy base materials filled with silica, alumina or anhydrides), the theory has been developed by the classical theory of deformable media, or fluid dynamics. The equations, cited above in the Summary, quantify the pressure drop of a deformable medium flowing in a tube, for laminar flow as well as turbulent flow. It the amount of fluid exiting from a series of outlets, which are reached by the fluid after flowing through different tube lengths, is required to be the same per unit of time, then the cross section of each outlet has to be modified in order to compensate for the different tube lengths. The design features, appropriate for the selected fuid, are best obtained graphically, as shown in the example of FIG. 10.

It is advantageous to construct the multiple-nozzle dispensing equipment such that the distribution nozzles are positioned in the repetitive distances ("pitch") of the chips-on-substrates aligned in a row for underfilling. An example is shown in FIG. 8 where the distribution nozzles are positioned so that every other chip can be served in one dispensing operation. After completing the underfilling of the first group of chips-on-substrates, the dispensing equipment is advanced in lockstep with the pitch of the aligned product, and the next group can be underfilled. In this fashion, even large numbers of product can be assembled in short time for mass production.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is, therfore, intended that the appended claims encompass any such modifications or embodiments.

What is claimed is:

1. A method for the fabrication of a semiconductor assembly comprising:

providing a semiconductor circuit chip having an integrated circuit;

said chip also having at least one layer of insulating material of low dielectric constant, wherein said at least one insulating layer is located in regions of different mechanical stress levels;

providing said chip with a first plurality of metal contact pads;

providing an electrically insulating substrate;

said substrate having a second plurality of metal contact pads; attaching one solder ball to each contact pad of the first plurality and aligning the assembled balls to the respective contact pads of said second plurality; supplying thermal energy to said semiconductor chip and said substrate, whereby the solder is reflowed to form solder joints and said chip is mounted to said substrate spaced apart by a gap, forming an assembly;

cooling said assembly from the reflow temperature to a temperature between 90 ° and 130 ° C. and maintaining said temperature at a substantially constant level, whereby said mechanical stress levels in said at least one dielectric layer and in said solder joints are kept at low values safe for operating said semiconductor assembly;

filling said gap with a polymeric precursor at said temperature between 90° C. and 130° C,; supplying additional thermal energy for curing said polymeric precursor, whereby a polymeric encapsulant is formed; and cooling the completed assembly to room temperature at specific rates, whereby said mechanical stress levels remain at low values safe for operating said semiconductor assembly.

2. The method according to claim 1 wherein gap is filled at approximately 100° C.

* * * * *